(12) United States Patent
Lu

(10) Patent No.: US 9,215,392 B2
(45) Date of Patent: Dec. 15, 2015

(54) IMPEDANCE READOUT CIRCUIT AND METHOD HAVING FILTER FOR DETERMINING AN AC CURRENT COMPONENT INVERSELY PROPORTIONAL TO THE OUTPUT IMPEDANCE OF A PIXEL

(71) Applicant: Palo Alto Research Center Incorporated, Palo Alto, CA (US)

(72) Inventor: JengPing Lu, Fremont, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 88 days.

(21) Appl. No.: 14/257,571

(22) Filed: Apr. 21, 2014

(65) Prior Publication Data
US 2015/0304581 A1    Oct. 22, 2015

(51) Int. Cl.
| H01J 40/14 | (2006.01) |
| H04N 5/378 | (2011.01) |
| H01L 27/146 | (2006.01) |
| H04N 5/376 | (2011.01) |
| H04N 5/357 | (2011.01) |

(52) U.S. Cl.
CPC .......... *H04N 5/378* (2013.01); *H01L 27/14609* (2013.01); *H01L 27/14612* (2013.01); *H04N 5/357* (2013.01); *H04N 5/376* (2013.01)

(58) Field of Classification Search
CPC ...... H01L 27/146; H01N 5/378; G01R 19/00; G01R 19/165
USPC .................. 250/214 R, 208.1, 214.1, 214 A; 348/302–311; 330/59, 308, 309; 327/514, 515
See application file for complete search history.

(56) References Cited

U.S. PATENT DOCUMENTS

| 4,359,756 | A | * | 11/1982 | Schneider | .............. H04N 9/793 348/457 |
| 5,325,442 | A | | 6/1994 | Knapp | |
| 5,940,526 | A | | 8/1999 | Setlak et al. | |
| 6,191,593 | B1 | | 2/2001 | Tartagni et al. | |
| 6,246,043 | B1 | | 6/2001 | Merrill | |
| 6,437,341 | B1 | | 8/2002 | Izumi et al. | |
| 6,681,033 | B1 | | 1/2004 | Yano et al. | |
| 6,974,971 | B2 | | 12/2005 | Young | |
| 7,006,078 | B2 | | 2/2006 | Kim | |
| 7,616,786 | B2 | | 11/2009 | Setlak | |
| 7,755,369 | B2 | | 7/2010 | Chuang et al. | |
| 8,441,459 | B2 | | 5/2013 | Chen et al. | |

(Continued)

FOREIGN PATENT DOCUMENTS

| CN | 102017147 | 4/2011 |
| JP | 2010517250 | 5/2010 |

OTHER PUBLICATIONS

U.S. Appl. No. 14/139,126, filed Dec. 23, 2013, Lu.

(Continued)

*Primary Examiner* — Que T Le
(74) *Attorney, Agent, or Firm* — Hollingsworth Davis, LLC

(57) ABSTRACT

An impedance readout circuit receives an input signal from a pixel, or an array of pixels. The circuit includes an amplifier to amplify the input signal and detects a DC component of the input signal. The circuit establishes an AC sampling voltage at the output of the amplifier enabling a filter of the circuit to determine an AC current component of the amplifier output. The AC current component is inversely proportional to the output impedance of the pixel.

20 Claims, 3 Drawing Sheets

(56) References Cited

U.S. PATENT DOCUMENTS

| | | |
|---|---|---|
| 8,519,320 B2 | 8/2013 | Miyazawa et al. |
| 8,618,865 B1 | 12/2013 | Lu |
| 2005/0094855 A1 | 5/2005 | Proano et al. |
| 2012/0075168 A1 | 3/2012 | Osterhout et al. |
| 2013/0200907 A1 | 8/2013 | Schneider et al. |

OTHER PUBLICATIONS

Hong, "On-chip Spatial Image Processing with CMOS Active Pixel Sensors", 2001, 234 pages.

File History for U.S. Appl. No. 14/139,129 as retrieved from the U.S. Patent and Trademark Office.

* cited by examiner

IMPEDANCE READOUT CIRCUIT AND METHOD HAVING FILTER FOR DETERMINING AN AC CURRENT COMPONENT INVERSELY PROPORTIONAL TO THE OUTPUT IMPEDANCE OF A PIXEL

TECHNICAL FIELD

The present disclosure relates to active pixel sensor (APS) arrays and, more particularly, to a readout circuit for reading the output produced by each pixel within the array.

BACKGROUND

The present disclosure relates to impedance readouts for active pixel sensors (APS). An APS is an image sensor that contains an array (rows and columns) of active pixels that incorporate amplifiers. One example of an APS includes a source follower array, i.e., an array wherein the pixel circuitry incorporates a source follower amplifier. Active pixel sensors are used in digital imaging applications such as filmless x-rays and fingerprint scanning. Other specific applications include but are not limited to mammography, radiography, cardiac imaging, and radiotherapy imaging.

SUMMARY

An example embodiment of an impedance readout circuit receives an input signal from a pixel a with source follower output stage or an array of pixels with a source-follower output stage. The circuit includes an amplifier to amplify the input signal and detects a DC component of the input signal. The circuit establishes an AC sampling voltage at the output of the amplifier enabling a filter of the circuit to determine an AC current component of the amplifier output. The AC current component is inversely proportional to the output impedance of the pixel. The advanced ability to ascertain the output impedance of the pixel, as compared to the traditional manner of ascertaining only the output voltage or current, provides a circuit designer with the ability to improve upon noise and linearity problems existent within a pixel or pixel array.

An example embodiment of an impedance readout circuit includes a means for receiving a signal generated by a pixel. It further includes a means for detecting a DC component of the signal and for producing an output. It further includes a means for establishing an AC voltage on the output and a means for detecting an AC current component of the output wherein the AC current component is inversely proportional to the output impedance of the pixel.

An example embodiment of a method for reading an output signal includes receiving an input signal from a pixel, amplifying the input signal to produce an amplified output, detecting the DC component of the input signal, establishing an AC voltage signal on the amplified output and filtering the amplified output to detect an AC current component of the amplified output wherein the AC current component is inversely proportional to the output impedance of the pixel.

The above summary is not intended to describe each embodiment or every implementation. A more complete understanding will become apparent and appreciated by referring to the following detailed description and claims in conjunction with the accompanying drawings.

BRIEF DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

As noted earlier, the present disclosure relates to impedance readouts for active pixel sensors (APS). An APS is an image sensor that contains an array (rows and columns) of active pixels. There are various types of pixel designs that may be used in an APS imager. Incorporated into each of the pixels described herein is a continuous photodiode structure that functions as a sensor of the pixel. In a typical APS configuration, the array of pixels is provided atop a substrate, such as glass, and is covered by a sensing plate or other type of shield material.

Example embodiments of an impedance readout circuit and method are described below. The impedance readout circuit is designed to work in conjunction with one or more APS pixels. The APS pixels may comprise any suitable configuration that includes a source-follower output stage. Examples of such pixels, various configurations of which are known in the art, are provided in FIGS. 1 and 2, along with the accompanying description, to provide the reader with a reference as to the operation of a pixel with a source-follower amplifier/output stage.

Figure 1:
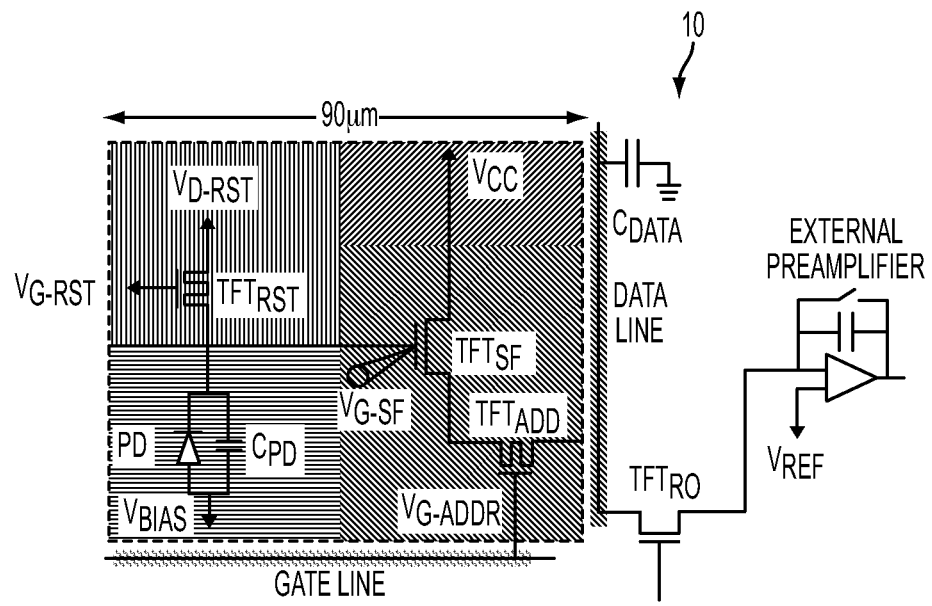
FIG. 1 is a schematic of a three thin film transistor (TFT) pixel.

Referring to FIG. 1, a circuit diagram of an APS pixel 10 is illustrated. Pixel 10 includes an addressing TFT ($TFT_{ADD}$) coupled to a pixel storage capacitor (with intrinsic capacitance $C_{PD}$ formed by the continuous photodiode (PD) structure). A voltage $V_{bias}$, provided by an external supply, establishes a reverse bias across the photodiode structure. The pixel additionally includes a reset TFT ($TFT_{RST}$) and a source-follower TFT ($TFT_{SF}$). When incident radiation is detected, the photodiode capacitance is discharged, causing the voltage at the gate of $TFT_{SF}$ ($V_{G\text{-}SF}$) to drop from the initial reset voltage of $V_{D\text{-}RST}$ in proportion to the imaging signal generated by the radiation. The imaging signal defined by this voltage change is then amplified by turning on $TFT_{ADD}$, resulting in a current flow that charges the capacitance $C_{data}$ of the corresponding data line. This current flow continues until the voltage of the data line approaches that of the gate contact of $TFT_{ADD}$, hence the name "source-follower." The resulting charge remains stored on the data line by keeping the readout TFT ($TFT_{RO}$), located at the periphery of the array, in the off state (i.e., nonconducting). The additional signal gain provided by the circuit of FIG. 1 is determined by the ratio of the capacitance of the data line to that of the photodiode, $C_{data}/C_{PD}$. The imaging signal stored in the data line capacitance is subsequently sampled by the external charge pre-amplifier via a multiplexer (not shown). After sampling, the data line is reset to a reference voltage, $V_{ref}$. Reset of the pixel is performed by turning $TFT_{RST}$ on using the gate line. Thus, when the voltage for a given gate line is switched to a positive value, this enables sampling of the charge from pixels along that line (by turning on the corresponding TFT$_{ADD}$ transistors) while simultaneously resetting pixels along the preceding gate line (by turning on the corresponding TFT$_{RST}$ transistors). The reset action restores the gate contact of TFT$_{SF}$ to its initial voltage of V$_{D-RST}$ and, thus the voltage across the photodiode to its initial value of (V$_{bias}$−V$_{D-RST}$).

Figure 2:
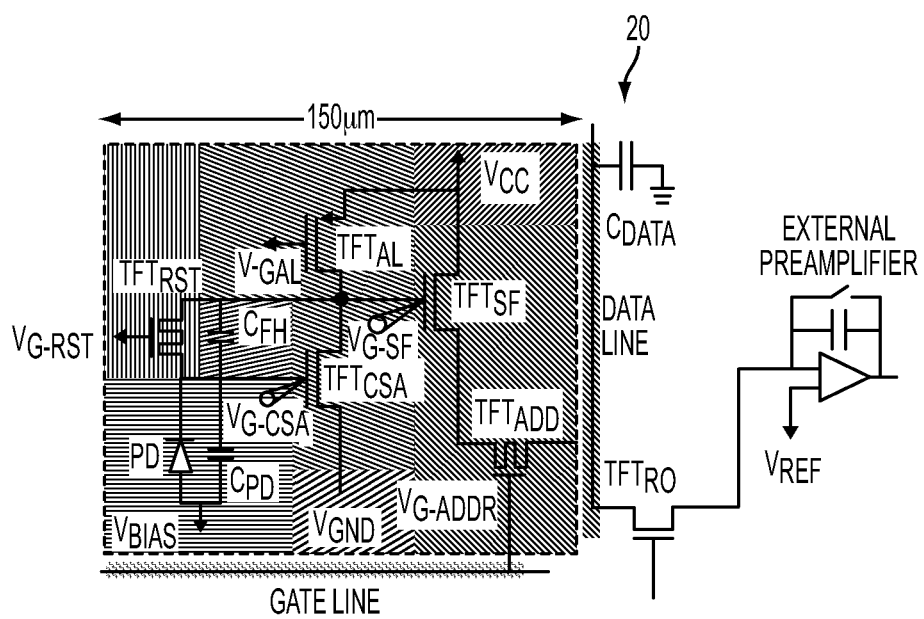
FIG. 2 is a schematic of a five TFT APS active pixel with a source-follower output stage.

The circuit diagram of FIG. 2 illustrates an APS pixel 20 that incorporates a dual-stage amplification structure in the form of a common-source amplifier in series with a source-follower amplifier. The design is similar to that of FIG. 1 except for the additional n-channel common-source amplifier TFT (TFT$_{CSA}$), the p-channel active load TFT (TFT$_{AL}$), and the feedback capacitor (C$_{FB}$)—which together constitute a first-stage amplification circuit. When incident radiation is detected, the photodiode capacitance is momentarily discharged, causing the voltage of the gate contact of TFT$_{CSA}$ (V$_{G-CSA}$) to drop. Due to the very high open loop gain (~80) of the first amplification stage, the voltage of the gate contact of TFT$_{SF}$ (V$_{G-SF}$) increases until V$_{G-SCA}$ is rapidly restored nearly to its initial value prior to irradiation. This results in the voltage (and thus the electric field strength) across the photodiode to remain largely constant during array operation. Amplification in the second stage of the pixel is provided by the same source-follower circuit as in the pixel of FIG. 1. The additional signal gain provided by the present pixel is largely determined by the ratio of the data line capacitance to the feedback capacitance, C$_{data}$/C$_{FB}$. The imaging signal stored on the data line capacitance is subsequently sampled, by a multiplexer (not shown), by an external charge pre-amplifier. After sampling, the data lines are reset to V$_{ref}$ and the pixel is reset through discharge of its capacitor C$_{FB}$ by rendering the TFT$_{RST}$ transistors to a conducting state. Whereas pixel reset for the pixel of FIG. 1 is performed one row of pixels at a time within the pixel array, the reset for the pixel of FIG. 2 within the pixel array is performed globally to all pixels prior to the delivery of radiation and the start of row-by-row readout.

For the APS pixels of FIGS. 1 and 2, the image information contained in the photodiode capacitor, C$_{PD}$, and the pixel storage capacitor, C$_{FB}$, respectively, is left undisturbed by readout and sampling by the external preamplifier since the pixel reset action is independent of readout. This feature allows for the possibility of more sophisticated readout protocols that can be used to reduce additive noise as will be described in further detail below.

In reference to the description above of APS pixels 10 and 20, it can be seen that the output of the source-follower TFT is typically, directly connected to the data line and further connected to an off substrate, ASIC readout chip. The readout ASIC typically has a charge sensitive amplifier/current amplifier as its first stage, front end (before an A/D converter). The voltage signal of the APS pixel 10 and 20 (the potential of the photodiode, FIG. 1, or the voltage output of the charge amplifier, FIG. 2) is readout by the relation of: I$_D$=0.5×(w/L)*μ*C$_0$*(V$_G$−V$_T$)$^2$, where the input signal squared is proportional to the readout current.

Several non-ideal effects are the result of this simple and straight-forward readout procedure. First, the output is non-linear relative to the input signal. This problem is further amplified by the fact that Poly-Si TFTs have inherently non-uniform voltage transients, V$_t$, such that the current variation is spread out further by the squared term. In principal, the quadratic relation can be mathematically corrected if everything is ideal, however, this is rarely the case. Second, the current readout is typically broadband, i.e., over a wide range of frequencies, and, as such, all the noise and pick up are integrated over a wide spectrum. This is usually not a problem for an enclosed system since pick up noise is typically negligible if the readout chips are mounted close enough to the source-follower array and since thermal noise can be somewhat improved by bandwidth limiting. However, pick up noise becomes difficult to manage for systems that have large sensor plates that are not entirely covered by shield material or for systems that need to mount readout chips far away from the sensor plate. Moreover, the noise of a typical source-follower array based on TFT technology is typically limited by the intrinsic 1/f noise of TFTs. This noise component is very fundamental and is difficult to mitigate with a simple current readout.

Various attempts have been made to mitigate the above-described non-ideal effects. For example, attempts have been made to mitigate the non-linear problem by using a voltage mode readout, a charge mode readout, and/or making the source-follower TFT work in the triode region. However, there are drawbacks associated with each of these proposed solutions. A voltage mode readout, as well as a charge mode readout, will typically cause data lines of the source-follower array to swing over a wide voltage range causing unexpected cross-talk. Further, a voltage readout typically requires a readout chip working in a TFT voltage range which thereby makes it incompatible with low voltage VLSI. Additionally, forcing the source-follower TFT to work in the triode region produces a readout sensitive to the resistivity of the data lines, the V$_{CC}$ lines, as well as sensitive to the cross-talk caused by the voltage drop of the V$_{CC}$ line.

Figure 3:
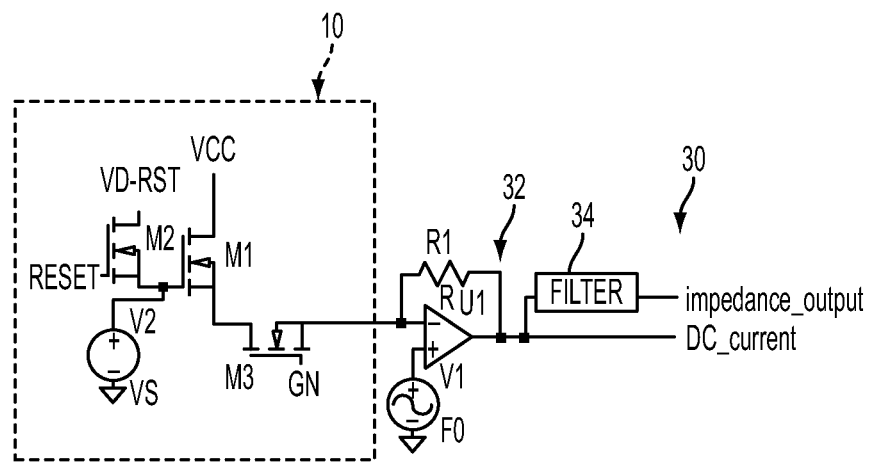
FIG. 3 is a schematic of an example embodiment of an impedance readout circuit coupled to the pixel of FIG. 1.

An example embodiment of the present disclosure, shown in FIG. 3, provides an option to mitigate the earlier-described non-ideal effects by utilizing the output impedance of the APS pixel 10. Specifically, FIG. 3 depicts an example embodiment of an impedance readout circuit 30 connected to the circuitry of APS pixel 10. Note that the photodiode, PD, of the APS pixel 10 has been roughly modeled as a voltage source, V$_S$, in this configuration. This has been done because most photodiodes, or other similar sensors, have an impedance that is much lower than the input capacitance of the source-follower transistor, TFT$_{SF}$. The impedance readout circuit 30 includes a trans-resistance amplifier 32, comprised of R1 and U1, to read out the DC term, I$_D$=0.5×(w/L)*μ*C$_0$*(V$_G$−V$_T$)$^2$. In addition, the readout circuit 30 superimposes a small AC voltage, V1, (with a frequency centered at f0) on the virtual ground voltage. The readout circuit 30 further provides a filter 34 to detect the AC current component in the output of the trans-resistance amplifier 32. The AC current component is inversely proportional to the output impedance of TFT$_{SF}$. Since it is assumed that the input impedance of TFT$_{SF}$ is approaching zero (voltage source), the output impedance of TFT$_{SF}$ is simply 1/g$_m$, or the AC output current is proportional to (w/L)*μ*C$_0$*(V$_G$−V$_T$)$^2$, where V$_G$ is simply the input voltage V$_S$. The linear output characteristic can then be achieved. Since the AC current is corresponding to the frequency of V1, the filter 34 can be designed with a narrow pass band to ensure a desired (e.g., maximum) noise and pick-up rejection. The impedance readout circuit 30 may be equally utilized with source-follower pixel 20 or other similarly configured circuit source-follower pixel.

One characteristic of the impedance readout circuit 30 is that by simultaneously reading out the DC component of I$_D$ and the AC component of the output impedance response, the intrinsic 1/f TFT noise may be partially mitigated. TFT 1/f noise can usually be modeled as two components: mobility fluctuation, which corresponds to μ fluctuation and carrier number fluctuation, which corresponds to V$_T$ fluctuation. Since it can be demonstrated that in dividing I$_D$ with g$_m$, the factor μ is cancelled out, one can deduce that 1/f caused by mobility fluctuation is mitigated.

The example embodiment of the impedance readout circuit 30 shown in FIG. 3 can be implemented with many variations. For instance, an example embodiment of the impedance readout circuit may utilize a filter 34 implemented in the analog domain. Alternatively, the filter 34 may be implemented in the digital domain, i.e., the output of the trans-resistance amplifier 32 can first be digitized (high speed A/D) and digital signal processing techniques may be used to detect the AC component.

Figure 4:
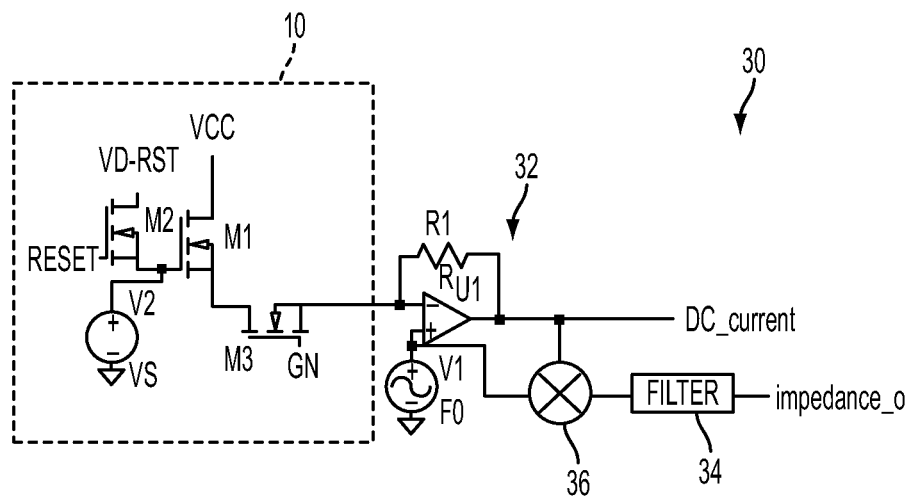
FIG. 4 is a schematic of an example embodiment of an impedance readout circuit coupled to the pixel of FIG. 1 with the impedance readout circuit further including a synchronous detector.

FIG. 4 depicts another example embodiment of the impedance readout circuit 30, wherein a synchronous detector 36 is additionally incorporated. Here an AC voltage source is further fed to the synchronous detector 36 such that synchronous/lock-in detection techniques can be implemented to further improve noise and pick-up rejection.

With current state of the art signal processing techniques, line bandwidth/noise rejection can be largely improved by mapping out the line impedance over a wide frequency range. A similar technique can be used here by intelligently controlling the AC source V1, sweeping the center frequency, or using a spread-spectrum-like-signal and adjusting the detector 36 correspondingly. In these more advanced embodiments, the output of the APS pixel 10 and/or 20, the data line, and the connections between the APS pixels in the array are simply treated as communication channels instead of circuit components and wires.

It should be noted that while the embodiments of impedance readout circuit 30 depicted in FIGS. 3 and 4 are based on a trans-resistance amplifier 32, other readout circuits such as a charge amplifier or direct A/D conversion may be used without departing from the spirit or scope of the invention presuming that an alternate configuration may simultaneously sample a DC component of $I_D$ and an AC component of the output impedance of an APS pixel 10 and/or 20, or equivalent circuit.

Figure 5:
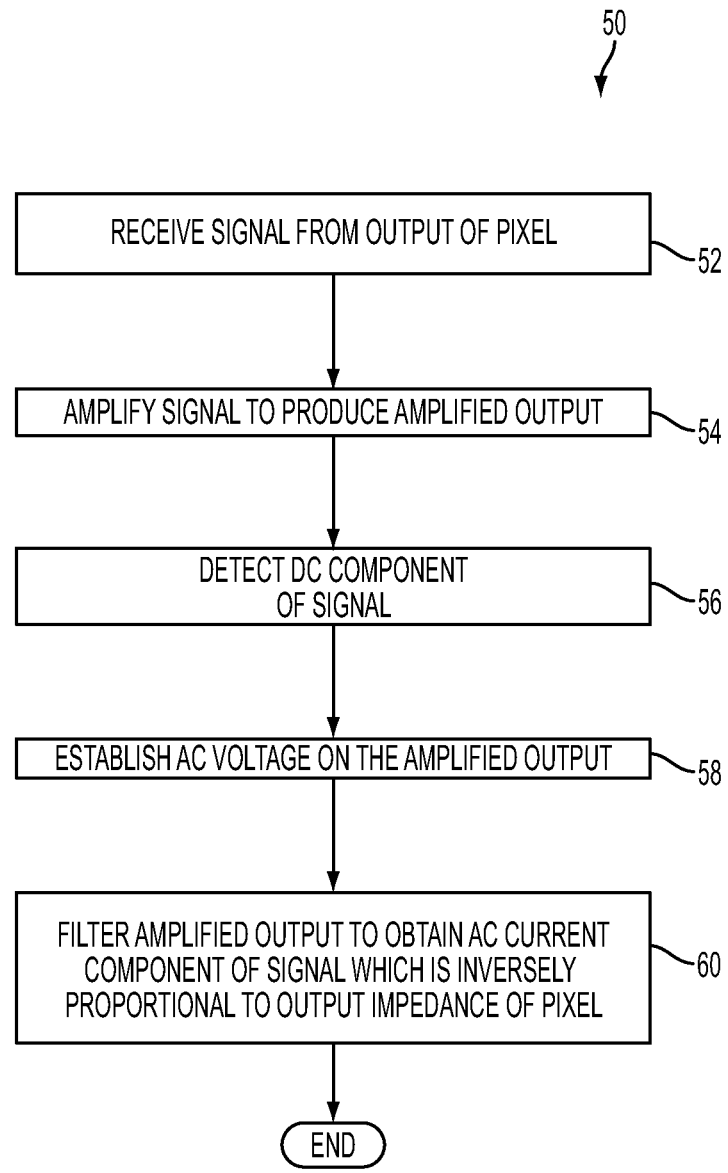
FIG. 5 is a block diagram illustrating a method of providing an impedance readout of a pixel.

A method 50 for reading an output signal, consistent with the description of the impedance readout circuit described above, is depicted in FIG. 5. The method includes receiving an input signal generated by a APS pixel 52. The input signal is amplified to produce an amplified output 54. The DC component of the input signal is detected 56 and an AC voltage is established on the amplified output 58. The amplified output is filtered to determine the AC current component of the input signal wherein the AC current component is inversely proportional to the output impedance of the APS pixel 60.

Systems, devices or methods disclosed herein may include one or more of the features structures, methods, or combination thereof described herein. For example, a device or method may be implemented to include one or more of the features and/or processes above. It is intended that such device or method need not include all of the features and/or processes described herein, but may be implemented to include selected features and/or processes that provide useful structures and/or functionality.

Various modifications and additions can be made to the disclosed embodiments discussed above. Accordingly, the scope of the present disclosure should not be limited by the particular embodiments described above, but should be defined only by the claims set forth below and equivalents thereof.

The invention claimed is:

1. An impedance readout circuit comprising:
   an amplifier configured to receive an input signal from a pixel, determine a DC component of the input signal, and produce an output; and
   an AC voltage source to establish a sampling voltage on the amplifier output; and
   a filter configured to determine an AC current component of the amplifier output, wherein the AC current component is inversely proportional to the output impedance of the pixel.

2. The impedance readout circuit of claim 1, wherein the pixel is contained in an array of pixels.

3. The impedance readout circuit of claim 1, wherein the amplifier is a trans-resistance amplifier.

4. The impedance readout circuit of claim 1, wherein the filter comprises an analog filter, a digital filter or a synchronous filter.

5. The impedance readout circuit of claim 1, wherein the DC component and the AC current component are read substantially simultaneously.

6. The impedance readout circuit of claim 5, wherein the substantially simultaneous reading of the DC component and the AC current component reduces noise generated by the pixel.

7. The impedance readout circuit of claim 5, wherein the substantially simultaneous reading of the DC component and the AC current component improvise linearity of the input signal.

8. The impedance readout circuit of claim 1, wherein the pixel includes between one and seven thin film transistors.

9. An impedance readout circuit comprising:
   means for receiving a signal generated by a pixel;
   means for detecting a DC component of the signal and for producing an output;
   means for establishing an AC voltage on the output;
   means for detecting an AC current component of the output, wherein the AC current component is inversely proportional to the output impedance of the pixel.

10. The impedance readout circuit of claim 9, wherein the pixel is contained in an array of source-follower pixels.

11. The impedance readout circuit of claim 9, wherein the pixel includes between one and seven thin film transistors.

12. The impedance readout circuit of claim 9, wherein the means for detecting a DC component and for producing an output comprises a trans-resistance amplifier.

13. The impedance readout circuit of claim 12, wherein means for establishing an AC voltage on the output comprises an AC voltage source.

14. The impedance readout circuit of claim 9, where the means for detecting an AC current component comprises a filter.

15. The impedance readout circuit of claim 9, wherein the means for detecting a DC component and means for detecting an AC current component operate substantially simultaneously.

16. The impedance readout circuit of claim 15, wherein the substantially simultaneous operation reduces noise in the signal generated by the pixel.

17. The impedance readout circuit of claim 15, wherein the substantially simultaneous operation improves linearity in the signal generated by the pixel.

18. A method for reading an output signal comprising:
   receiving an input signal from a pixel;
   amplifying the input signal to produce an amplified output;
   detecting the DC component of the input signal;
   establishing an AC voltage signal on the amplified output;
   filtering the amplified output to detect an AC current component of the amplified output, wherein the AC current component is inversely proportional to the output impedance of the pixel.

19. The method of claim 18, wherein the source-follower pixel is contained in an array of pixels.

20. The method of claim 18, wherein detecting the DC component and detecting the AC current component are performed substantially simultaneously.

\* \* \* \* \*